US008570106B2

(12) United States Patent
Kim et al.

(10) Patent No.: US 8,570,106 B2
(45) Date of Patent: Oct. 29, 2013

(54) POSITIVE FEEDBACK COMMON GATE LOW NOISE AMPLIFIER

(75) Inventors: Namsoo Kim, San Diego, CA (US); Joseph Patrick Burke, Glenview, IL (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 13/107,737

(22) Filed: May 13, 2011

(65) Prior Publication Data
US 2012/0286874 A1 Nov. 15, 2012

(51) Int. Cl.
*H03F 1/38* (2006.01)
(52) U.S. Cl.
USPC .......................................... 330/291; 330/260
(58) Field of Classification Search
USPC ............................................ 330/85, 260, 291
See application file for complete search history.

(56) References Cited

U.S. PATENT DOCUMENTS

| 4,739,282 | A | | 4/1988 | Scheinberg | |
|---|---|---|---|---|---|
| 6,150,881 | A | * | 11/2000 | Lovelace et al. | 330/259 |
| 7,317,351 | B2 | * | 1/2008 | Taylor | 330/85 |
| 7,414,481 | B2 | * | 8/2008 | Li et al. | 330/311 |
| 2011/0102088 | A1 | * | 5/2011 | Rajendran et al. | 330/277 |

OTHER PUBLICATIONS

International Search Report and Written Opinion—PCT/US2012/037105—ISA/EPO—Jul. 5, 2012.
Liscidini A., et al., "A 0.13/spl mu/m CMOS Front-End for DCS1800/UMTS/802.11b-g with Multi-band Positive Feedback Low Noise Amplifier", VLSI Circuits, 2005. Digest of Technical Papers. 2005 Symposium on, IEEE, Piscataway, NJ, USA, Jun. 2005, pp. 406-409, XP010818459, DOI:10.11091 VLSIC.2005.1469415 ISBN: 978-4-900784-01-7 p. 406, right-hand col., line 11—p. 408, left-hand col., line 19; figures 2,3.
Park J., et al., "A Direct-Conversion CMOS RF Receiver Reconfigurable From 2 to 6 GHz", IEEE Transactions on Microwave Theory and Techniques, IEEE Service Center, Piscataway, NJ, US, vol. 58, No. 9, Sep. 1, 2010, pp. 2326-2333, XP011316360, ISSN: 0018-9480 p. 2326, right-hand col., line 1—p. 2328, left-hand col., line 34; figures 1,3,9.
Xiong S., et al., "A dual-band 2.1GHz/5.2GHz LNA for reconfigurable radio", Solid-State and Integrated Circuit Technology (ICSICT), 2010 10th IEEE International Conference on, IEEE, Piscataway, NJ, USA, Nov. 1, 2010, pp. 710-712, XP031835018, ISBN: 978-1-4244-5797-7 p. 710, left-hand col., line 2-13 p. 712, left-hand col., line 10; figures 1,3,4.
Yanduru K., et al., "A highly integrated GPS front-end for cellular applications in 90nm CMOS", Circuits and Systems Workshop: System-On-Chip—Design, Applications, Integration, and Software, 2008 IEEE Dallas, IEEE, Piscataway, NJ, USA, Oct. 19, 2008, pp. 1-4, XP031368233, ISBN: 978-1-4244-2955-4 p. 2, left-hand col., line 2—p. 2, right-hand col., line 3; figure 2.

* cited by examiner

*Primary Examiner* — Khanh V Nguyen
(74) *Attorney, Agent, or Firm* — William M. Hooks

(57) ABSTRACT

A Positive Feedback Common Gate Low Noise Amplifier (PFCGLNA) has positive feedback transistors and input transistors that are of the same conductivity type. Making the positive feedback and input transistors of the same conductivity type reduces sensitivity to process variations. Noise generated by the positive feedback transistors is used to cancel noise generated by the input transistors. In one embodiment, the PFCGLNA: 1) is tunable to have a substantially constant input impedance for any frequency in a wideband frequency range from 680 MHz to 980 MHz, and 2) has a noise figure less than 2.2 dB over the entire wideband frequency range. The input impedance of the PFCGLNA can be tuned to match a source that drives the PFCGLNA by setting a multi-bit digital control value supplied to a digitally-programmable tank load of the LNA.

18 Claims, 16 Drawing Sheets

MULTIPLE NARROW BAND LNAS

WIDEBAND LNA WITH NON-TUNABLE INPUT IMPEDANCE

WIDEBAND LNA WITH NON-TUNABLE INPUT IMPEDANCE

WIDEBAND LNA WITH NON-TUNABLE INPUT IMPEDANCE

WIDEBAND LNA WITH TUNABLE INPUT IMPEDANCE BUT NOISE
AND INSTABILITY PROBLEMS

POSITIVE FEEDBACK COMMON GATE LNA
(PFCGLNA)

POSITIVE FEEDBACK COMMON GATE LNA

MODEL OF A CONVENTIONAL PFCGLNA OF FIG. 5

$$|Z_{IN}| \approx \frac{1}{2 \cdot G_{M1} \cdot (1 - G_{M2} \cdot |Z_{TANK}|)}$$

INPUT IMPEDANCE

CONVENTIONAL LNA IS UNSTABLE WHEN DENOMINATOR IS NEGATIVE AS A RESULT OF CHANGES IN THE $G_{M2}$ TO $G_{M1}$ RATIO

IMPEDANCE OF TANK LOAD

IMPEDANCE EQUATION FOR THE CONVENTIONAL PFCGLNA OF FIG. 10

INPUT IMPEDANCE VERSUS TRANSCONDUCTANCE RATIO FOR
CONVENTIONAL PFCGLNA AND FOR PFCGLNA OF FIG. 9

MODEL OF A SINGLE-ENDED EXAMPLE OF THE PFCGLNA OF FIG. 9

INPUT IMPEDANCE $$|Z_{IN}| \approx \frac{1}{2 \cdot G_{M1} + G_{M2} \cdot \left( \dfrac{1 - G_{M1} \cdot |Z_{TANK}|}{1 + G_{M2} \cdot |Z_{TANK}|} \right)}$$

LNA IS STABLE BECAUSE DENOMINATOR REMAINS POSITIVE FOR CHANGES IN $G_{M2}$ TO $G_{M1}$ RATIO

IMPEDANCE OF TANK LOAD

IMPEDANCE EQUATION FOR THE PFCGLNA OF FIG. 13

$$\overline{I_{M1}^2} \propto \left| \frac{1 + G_{M2} \cdot R_S}{1 + R_S \cdot G_{M1} + \underbrace{\left[G_{M2} \cdot \left(R_S - G_{M1} \cdot |Z_{TANK}|\right)\right]}_{178}} \right|$$

DUE TO POSITIVE FEEDBACK (CAN MAKE OVERALL DENOMINATOR SMALLER)

NOISE AT THE INPUT TRANSISTOR OF CONVENTIONAL RFCGLNA OF FIG. 5

FIG. 15

$$\overline{I_{M2}^2} \propto \left| \frac{G_{M1} \cdot R_S}{1 + R_S \cdot G_{M1} + \underbrace{\left[G_{M2} \cdot \left(R_S - G_{M1} \cdot |Z_{TANK}|\right)\right]}_{179}} \right|$$

DUE TO POSITIVE FEEDBACK (CAN MAKE OVERALL DENOMINATOR SMALLER)

NOISE AT THE POSITIVE FEEDBACK TRANSISTOR OF CONVENTIONAL PFCGLNA OF FIG. 5

FIG. 16

$$\overline{I_{M1}^2} \propto \left| \frac{1}{1 + R_S \cdot G_{M1} + \underbrace{\left[G_{M2} \cdot \left(R_S + |Z_{TANK}|\right)\right]}_{180}} \right|$$

DUE TO POSITIVE FEEDBACK (MAKES OVERALL DENOMINATOR LARGER)

NOISE AT THE INPUT TRANSISTOR OF PFCGLNA OF FIG. 9

FIG. 17

$$\overline{I_{M2}^2} \propto \left| \frac{1}{1 + R_S \cdot G_{M1} + \underbrace{\left[G_{M2} \cdot \left(R_S + |Z_{TANK}|\right)\right]}_{181}} \right|$$

DUE TO POSITIVE FEEDBACK (MAKES OVERALL DENOMINATOR LARGER)

NOISE AT THE POSITIVE FEEDBACK TRANSISTOR OF PFCGLNA OF FIG. 9

FIG. 18

INPUT IMPEDANCE IS MAINTAINED AT A CONSTANT 50 OHMS ACROSS
WIDEBAND TUNING FREQUENCY RANGE

POWER GAIN VERSUS INPUT FREQUENCY

EXTRAPOLATED MAXIMUMS OF POWER GAIN VERSUS INPUT
FREQUENCY ACROSS INPUT MATCH DCS VALUES

NOISE FIGURE VERSUS INPUT SIGNAL FREQUENCY

EXTRAPOLATED MINIMUMS OF NOISE FIGURE VERSUS INPUT FREQUENCY ACROSS INPUT MATCH DCS VALUES

POSITIVE FEEDBACK COMMON GATE LOW NOISE AMPLIFIER

BACKGROUND INFORMATION

1. Technical Field

The disclosed embodiments relate to Low Noise Amplifiers (LNAs), and more particularly to common gate LNAs.

2. Background Information

LNAs are used in many applications, including use in cellular telephone receivers. A signal received onto an antenna of such a receiver is typically weak and requires amplification for subsequent stages of the cellular telephone operation. An LNA is typically used to amplify such a signal. In such an application, the LNA should introduce as little noise as possible into the system. Noise generated by a poor LNA may be amplified during subsequent stages and could result in poor phone reception. In addition to having good noise performance, many LNAs today are to be operable over a wide frequency range. Two typical architectures are usually utilized to realize these performance objectives: common source LNAs and common gate LNAs. However, problems exist with both LNA architectures as described below.

FIG. 1 (Prior Art) is a simplified block diagram of one way of accomplishing wideband LNA operation. Rather than employing one wideband LNA, multiple narrow band common source LNAs are employed where each narrow band LNA operates over a different part of the wide frequency range to be served. Each LNA may operate in a different narrow frequency band that is usually less than 100 MHz wide. Each of the narrow band LNAs requires its own filter and matching components. In some cases, ten frequency bands of operation are required so ten LNAs are required, and ten filters are required, and ten sets of matching components are required. Providing all this hardware is costly and large and consumes a lot of power.

FIGS. 2, 3 and 4 (Prior Art) are circuit diagrams of wideband non-tunable LNAs. FIG. 2 is a circuit diagram of a differential non-tunable common gate LNA. LNA 1 is said to be "non-tunable" because its input impedance can not be controlled and its input impedance may change as a function of the frequency of the signal being amplified. Since LNA 1 cannot be tuned, LNA 1 may exhibit poor noise performance in some applications. LNA 1 also utilizes off chip inductors which are costly and use board area. Additionally, positive feedback transistor 2 generates noise and decreases the noise performance of the LNA. FIG. 3 is a circuit diagram of a single input, differential output common gate LNA. LNA 3 is also non-tunable and has poor noise characteristics in some operating conditions. FIG. 4 is a diagram of a first stage of a differential non-tunable common gate LNA. LNA 4 is also non-tunable and has noise problems in some operating conditions.

FIG. 5 (Prior Art) is a circuit diagram of a wideband tunable LNA referred to as a Positive Feedback Common Gate LNA (PFCGLNA). LNA 5 can be tuned so that its input impedance matches the impedance of the source driving the LNA, but LNA 5 has instability and performance problems. LNA 5 has P-channel positive feedback transistors and N-channel input transistors. The positive feedback and input transistors should be matched in order for LNA 5 to be stable. Label M1 in FIG. 5 identifies one of the input transistors. Label M2 in FIG. 5 identifies a positive feedback transistor that should be matched to input transistor M1. Maintaining this matched condition despite process variations in the semiconductor manufacturing processes used to fabricate the PFCGLNA is difficult. In addition to instability problems, LNA 5 also suffers noise performance problems. Under certain operating conditions, noise generated by the LNA's positive feedback circuitry is amplified. A wideband tunable common gate LNA with improved stability and noise characteristics is desired.

SUMMARY

A Positive Feedback Common Gate Low Noise Amplifier (PFCGLNA) has positive feedback transistors and input transistors that are of the same conductivity type. Making the positive feedback and input transistors of the same conductivity type improves LNA stability over process and improves yield because process changes tend to affect the positive feedback and input transistors in the same way. Noise generated by the positive feedback transistors is used to cancel noise generated by the input transistors. In one embodiment, the PFCGLNA: 1) is tunable to have a substantially constant input impedance for any desired input signal frequency in a wideband frequency range from 680 MHz to 980 MHz, and 2) has a noise figure less than 2.2 dB over the entire wideband frequency range. The input impedance of the PFCGLNA can be tuned to match the impedance of a source that drives the PFCGLNA by setting a multi-bit digital control value supplied to a digitally-programmable tank load of the LNA. The multi-bit digital control value changes a capacitance of the tank load and this in turn changes the input impedance of the PFCGLNA. By proper setting of the multi-bit digital control value as a function of input signal frequency, the PFCGLNA can be made to have a substantially constant input impedance for an input signal of any desired frequency in the wideband frequency range while simultaneously having a noise figure of less than 2.2 dB. The input impedance of the PFCGLNA may also be tuned to match a variable source impedance of the source device that drives the PFCGLNA. In such an operation, the input impedance of the PFCGLNA may not remain constant during operation and the PFCGLNA may not always achieve optimal gain but yet the PFCGLNA remains impedance matched to the source.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 15 shows an equation for noise at the input transistor of the conventional PFCGLNA of FIG. 5.

FIG. 16 shows an equation for noise at the positive feedback transistor of the conventional PFCGLNA of FIG. 5.

FIG. 17 shows an equation for noise at the input transistor of the PFCGLNA of FIG. 9.

FIG. 18 shows an equation for noise at the positive feedback transistor of the PFCGLNA of FIG. 9.

DETAILED DESCRIPTION

Figure 6:
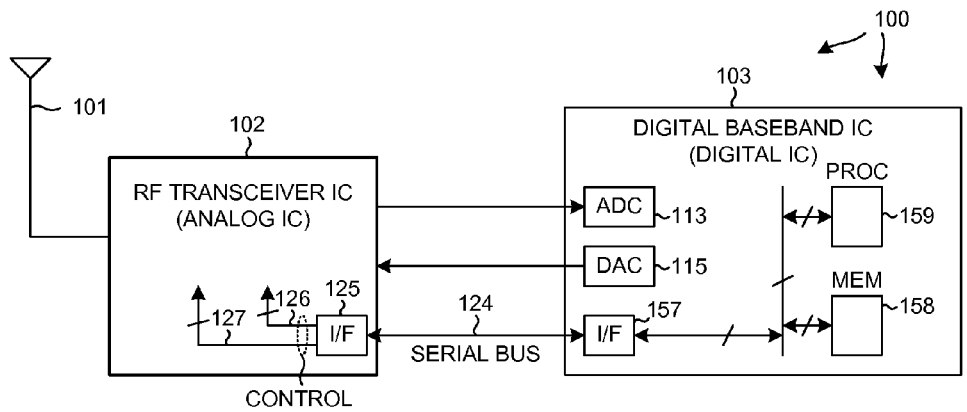
FIG. 6 is a very simplified high level block diagram of one particular type of mobile communication device 100 in accordance with one novel aspect.

FIG. 6 is a simplified high level block diagram of a mobile communication device 100. The mobile communication device 100 is an example of a device that includes a Positive Feedback Common Gate Low Noise Amplifier (PFCGLNA) in accordance with one novel aspect. In this example, mobile communication device 100 is a cellular telephone. The cellular telephone includes (among several other components not illustrated) an antenna 101 and two integrated circuits 102 and 103. Integrated circuit 103 is called a "digital baseband integrated circuit." Integrated circuit 102 is a Radio Frequency (RF) transceiver integrated circuit. RF transceiver integrated circuit 102 is called a "transceiver" because it includes a transmitter as well as a receiver.

Figure 7:
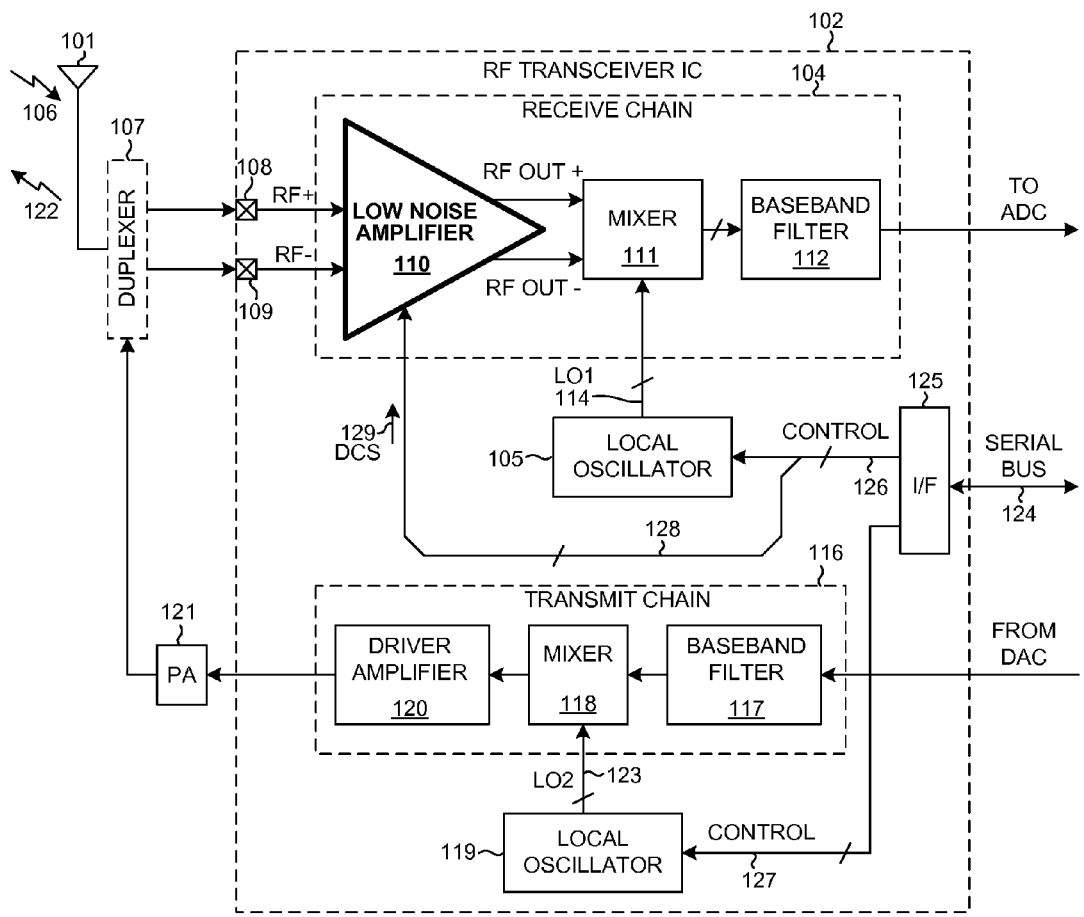
FIG. 7 is a more detailed block diagram of the RF transceiver integrated circuit 102 of FIG. 6.

FIG. 7 is a more detailed block diagram of the RF transceiver integrated circuit 102 of FIG. 6. The receiver includes what is called a "receive chain" 104 as well as a Local Oscillator (LO) 105. When the cellular telephone is receiving, a high frequency RF signal 106 is received on antenna 101. Signal 106 passes through duplexer 107 and is supplied to the receive chain 104 on input terminals 108 and 109 in the form of differential signals RF+ and RF−. The differential signal (RF+, RF−) is amplified by a Low Noise Amplifier (LNA) 110. LNA 110 also receives a multi-bit Digital Control Signal (DCS) 129 supplied from digital baseband integrated circuit 103 via control lines 128. DCS 129 sets the input impedance of LNA 110 to match an impedance of the device driving the LNA. LNA 110 supplies an amplified differential signal (RF OUT+, RF OUT−) to downconverting mixer 111. The resulting down-converted signal is filtered by a baseband filter 112 and is passed to the digital baseband integrated circuit 103. An analog-to-digital converter 113 in the digital baseband integrated circuit 103 converts the signal into digital form and the resulting digital information is processed by digital circuitry in the digital baseband integrated circuit 103. The digital baseband integrated circuit 103 tunes the receiver by controlling the frequency of the Local Oscillator (LO1) signal supplied via conductors 114 to mixer 111.

If the cellular telephone is transmitting, then information to be transmitted is converted into analog form by a Digital-to-Analog Converter (DAC) 115 in the digital baseband integrated circuit 103 and is supplied to a "transmit chain" 116 in the RF transceiver integrated circuit 103. Baseband filter 117 filters out noise due to the digital-to-analog conversion process. Mixer block 118 under control of local oscillator 119 up-converts the signal into a high frequency signal. Driver amplifier 120 and an external power amplifier 121 amplify the high frequency signal to drive antenna 101 so that a high frequency RF signal 122 is transmitted from antenna 101. The digital baseband integrated circuit 103 controls the transmitter by controlling the frequency of a local oscillator signal (LO2) supplied via conductors 123 to mixer 118. Digital baseband integrated circuit 103 controls the local oscillators 105 and 119 by sending appropriate control information across a digital serial bus 124, through bus interface 125, and control lines 126 and 127.

Figure 8:
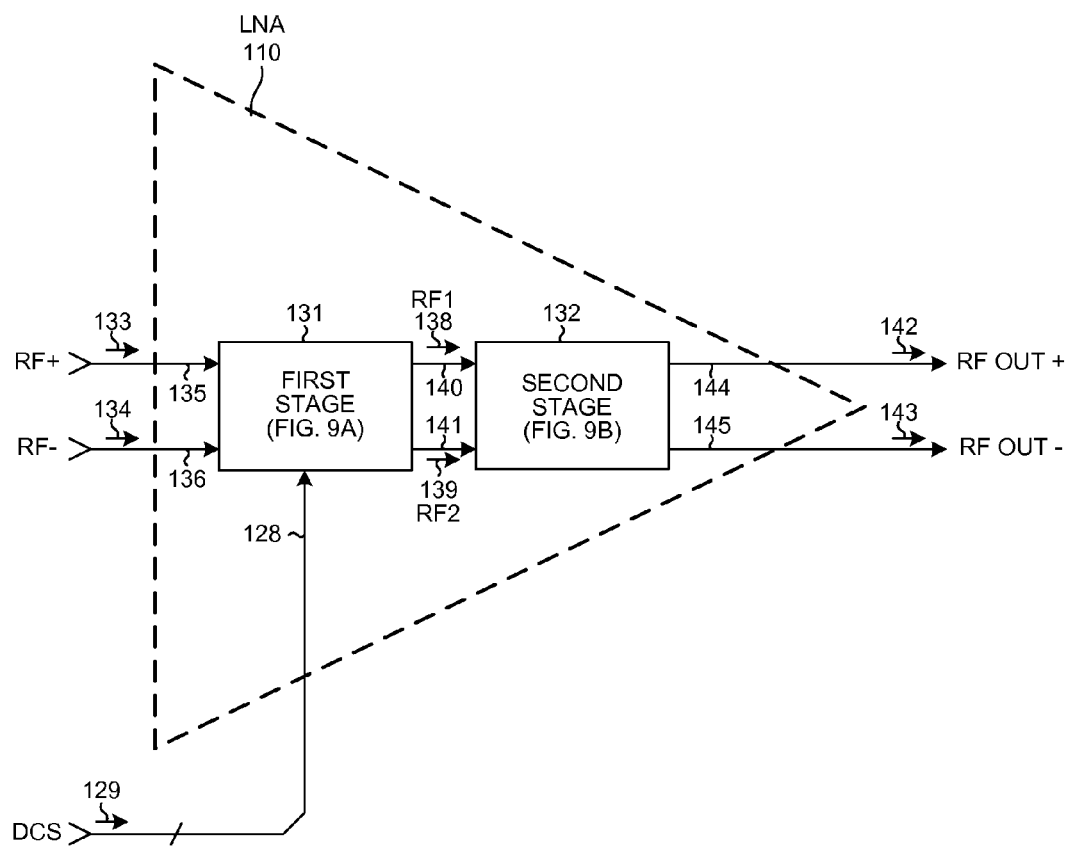
FIG. 8 is a block diagram of the LNA 110 of FIG. 7.

FIG. 8 is a block diagram of LNA 110 of FIG. 7. LNA 110 is a Positive Feedback Common Gate Low Noise Amplifier (PFCGLNA). LNA 110 includes a first stage 131 and a second stage 132. First stage 131 receives differential signals RF+ 133 and RF− 134 via first input lead 135 and second input lead 136, respectively. First stage 131 additionally receives the multi-bit digital signal DCS 129 via conductors 128. DCS 129 tunes a digitally-programmable tank load in first stage 131 (not shown in FIG. 8) thereby also setting an input impedance of the LNA. First stage 131 supplies differential signals RF1 138 and RF2 139 to second stage 132 via output conductors 140 and 141, respectively. Second stage 132 supplies amplified differential signals RF OUT+ 142 and RF OUT− 143 onto output conductors 144 and 145, respectively. Further details of first stage 131 and second stage 132 are shown in FIGS. 9A and 9B.

Figure 9A:
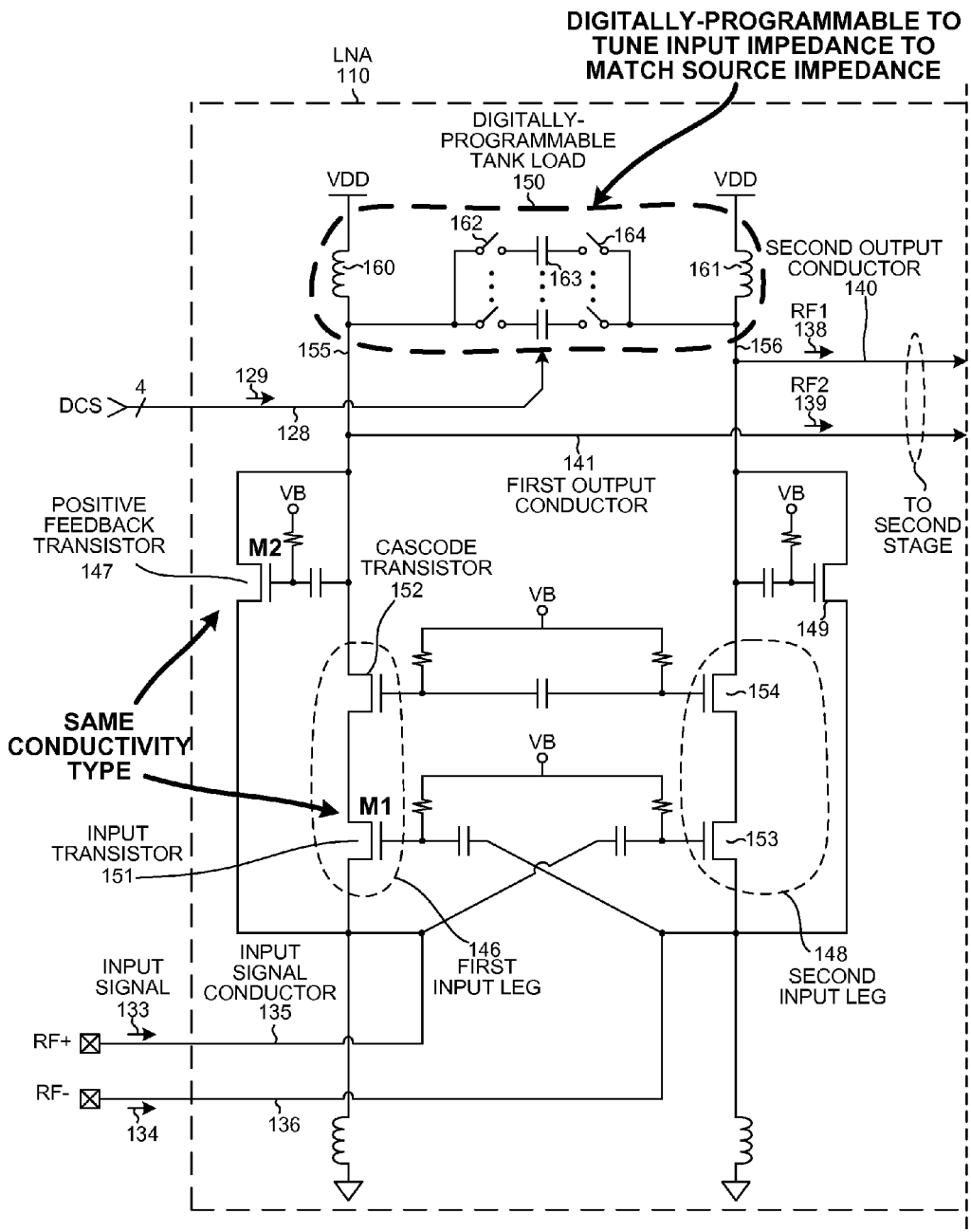
FIG. 9A is a circuit diagram of first stage 131 of LNA 110.
Figure 9B:
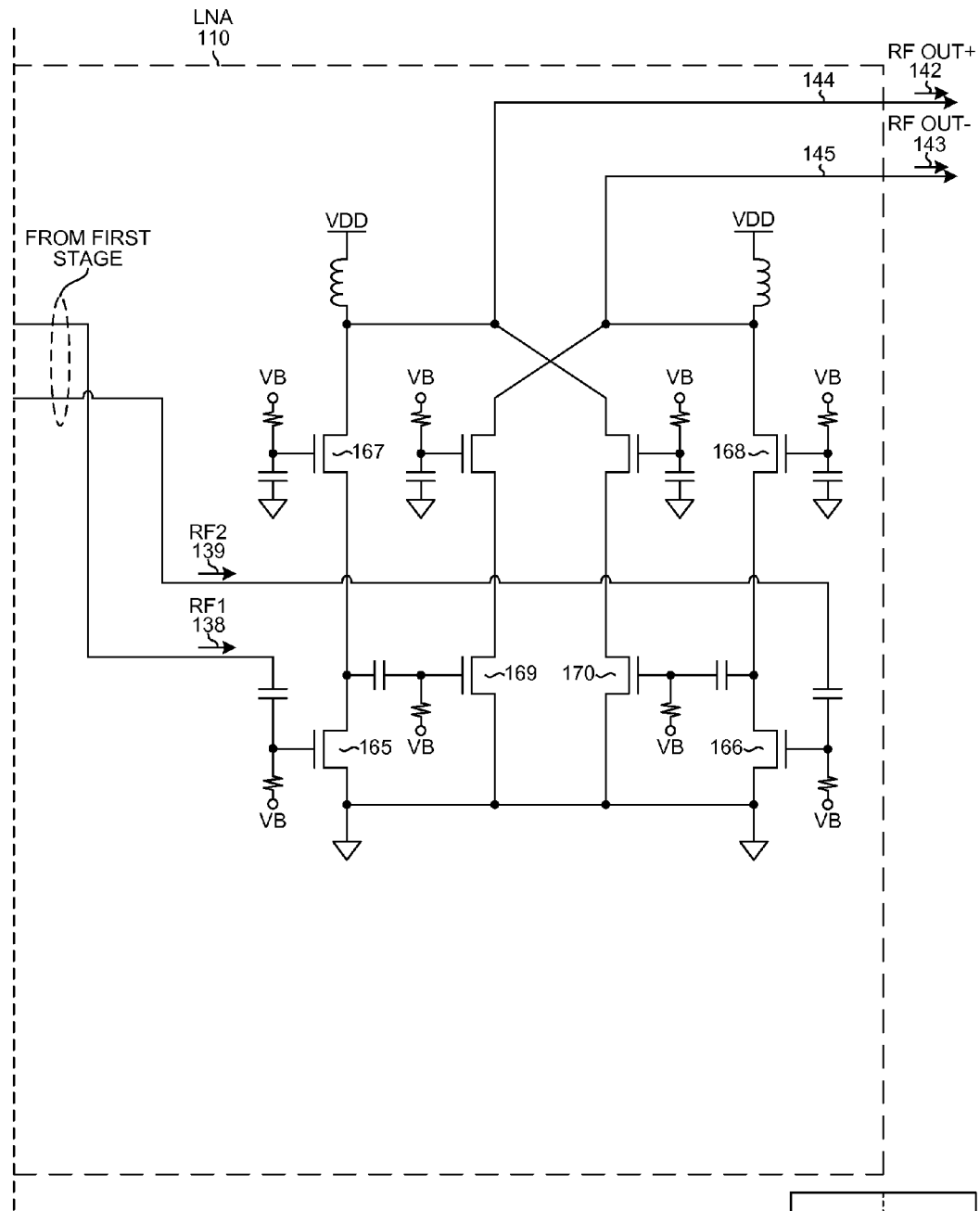
FIG. 9B is a circuit diagram of second stage 132 of LNA 110.

FIGS. 9A and 9B are more detailed circuit diagrams of the PFCGLNA of FIG. 8. FIG. 9A is a simplified circuit diagram of first stage 131. First stage 131 includes a first input leg 146, a first positive feedback transistor M2 147, a second input leg 148, a second positive feedback transistor 149, and a digitally-programmable tank load 150. First input leg 146 further includes first input transistor M1 151 and first cascode transistor 152, and second leg 147 further includes second input transistor 153 and second cascode transistor 154. Signal RF+ 133 is supplied onto the source of first input transistor 151 via input signal conductor 135. Signal RF− 134 is supplied onto the source of second input transistor 153 via input signal conductor 136.

In a first aspect, the PFCGLNA of FIG. 9 has the digitally-programmable tank load 150 that allows the input impedance to remain substantially constant for input signal frequencies anywhere in a wideband tuning frequency range. The digitally-programmable tank load 150 includes a pair of input leads 155 and 156, a pair of inductors 160 and 161, a set of capacitors 163, and a set of switches 162 and 164. The DCS value 129 received via conductors 128 controls the switches and determines how many of the capacitors are coupled together in parallel. The tank load 150 can be tuned in this way by changing DCS 129 so that the natural oscillating frequency of the tank can be set anywhere in a wideband tuning frequency range from 680 MHz to 980 MHz. In one example, the natural oscillating frequency of tank load 150 is set to be the frequency of the input signal so that the power gain of LNA 110 is at a maximum. LNA 110 can be tuned in this way for an input signal frequency anywhere in the wideband tuning frequency range. Rather than the input impedance of LNA 110 changing as a function of input signal frequency and thereby disturbing impedance matching with a device driving LNA 110, the digitally-programmable tank load 150 is tuned as a function of the frequency of the input signal so that the input impedance is substantially constant regardless of where the input signal frequency is in the wideband tuning frequency range. By making the transconductance of the positive feedback transistor variable, by setting it appropriately, and by setting the DCS value appropriately, the input impedance can be set to have a value anywhere in the range from twenty ohms to seventy-five ohms in this embodiment at any input signal frequency in the wideband tuning frequency range.

In a second aspect, the PFCGLNA of FIG. 9 has improved stability because the input transistors 151 and 153 and the positive feedback transistors 147 and 149 are of the same conductivity type. In this example, the input and positive feedback transistors are N-channel Field Effect Transistors (NFETs). Because they are of the same conductivity type, LNA stability is improved over process variations because semiconductor fabrication process changes tend to affect the input and positive feedback transistors in the same way as compared to the conventional PFCGLNA of FIG. 5 where changes in process can affect P-channel transistors differently than N-channel transistors. Furthermore, the stability of LNA 110 is also dependent on the input impedance, and when the real part of input impedance is negative, LNA 110 is unstable. Input impedance is a function of the transconductance ratio $G_{M2}$ to $G_{M1}$ (see the equation of FIG. 13). LNA 110 remains stable across varying transconductance ratios, partly due to the equivalent conductivity types of the input and positive feedback transistors (see the graph of FIG. 12).

In a third aspect, the PFCGLNA of FIG. 9 has a low noise figure below 2.2 dB over the entire wideband tuning frequency range due to positive feedback noise canceling. Noise generated by the input transistor is canceled by noise generated by the positive feedback transistor. Furthermore, input signal conductor 136 is capacitively coupled to a gate of first input transistor 151, and input signal conductor 135 is capacitively coupled to a gate of second input transistor 153. By capacitively cross-coupling first input transistor 151 and second input transistor 153 in this way, the transconductance of the input stage is boosted without requiring the use of extra current. In order to attain a low noise figure and low current consumption, first input transistor 151 and second input transistor 153 must have relatively large geometries. Without first cascode transistor 152 and second cascode transistor 154, the large geometries of these input transistors would add substantial parasitic capacitance to the resonant load. This problem is mitigated in the PFCGLNA of FIG. 9 by utilizing cascode devices 152 and 154 and supplying a high bias voltage VB onto a gate of the cascode devices.

FIG. 9B is a simplified circuit diagram of second stage 132 of LNA 110. In one example, second stage 132 is a common source amplifier. Common source amplifier 132 provides a higher load impedance to the first stage output, RF1 138 and RF2 139. Input transistors 165 and 166 form the input stage of second stage 132. Cascode transistors 167 and 168 help to minimize the parasitic capacitance of input transistors 165 and 166. Transistors 169 and 170 form the IM3 cancellation path and boost the transconductance of second stage 132, since it is operating in a sub-threshold region. Differential signals RF OUT+ 142 and RF OUT− 143 are then supplied onto output conductors 144 and 145. For additional information on second stage 132 of LNA 110, refer to U.S. Patent Publication 2007/0030076, entitled "Amplifier With Active Post-Distortion Linearization".

Figure 1:
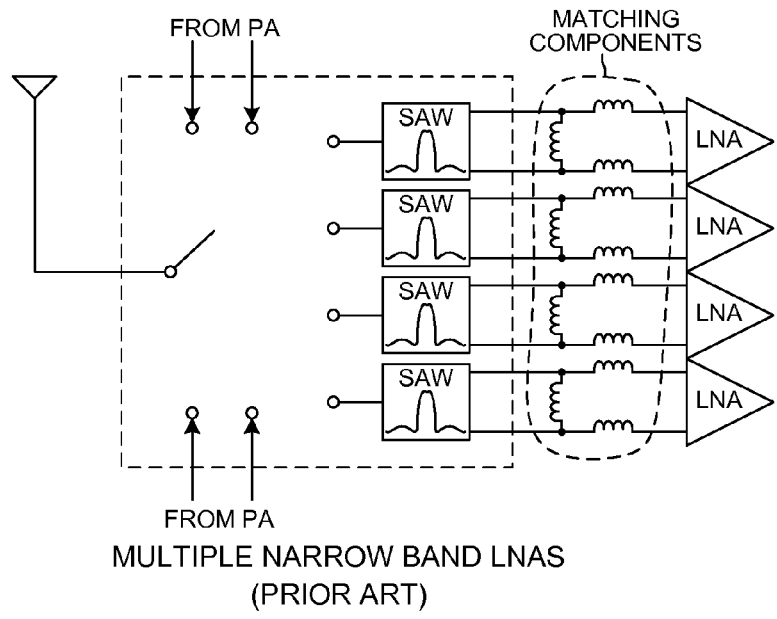
FIG. 1 (Prior Art) is a simplified block diagram of a system of multiple narrow band LNAs.
Figure 2:
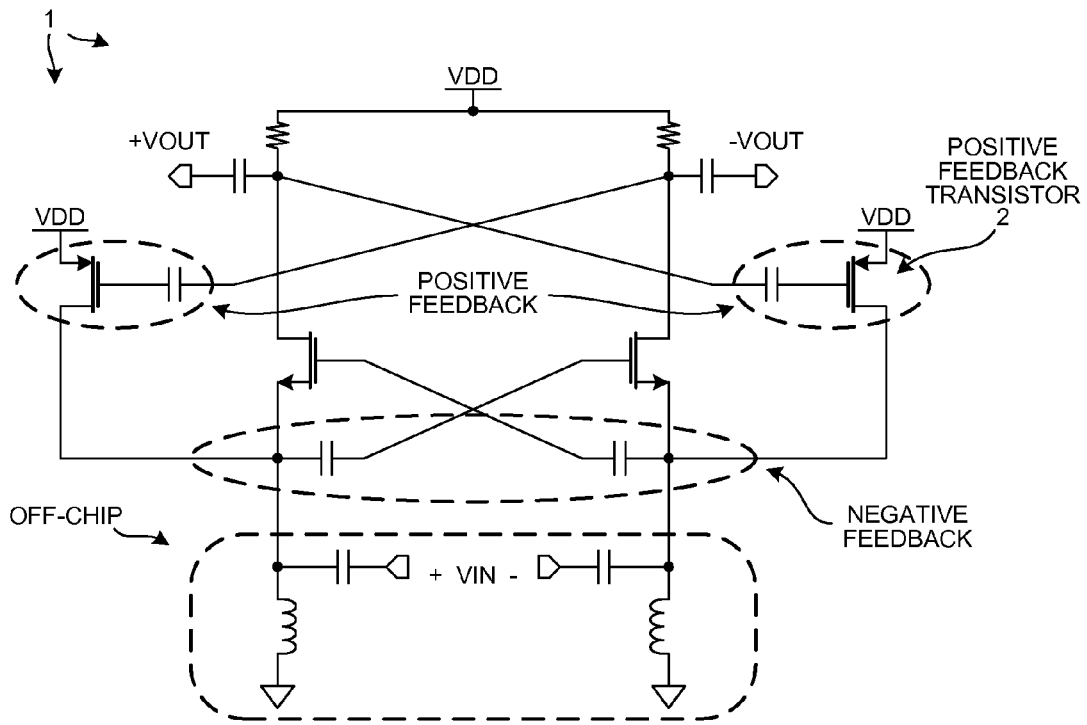
FIG. 2 (Prior Art) is a circuit diagram of a differential wideband non-tunable LNA.
Figure 3:
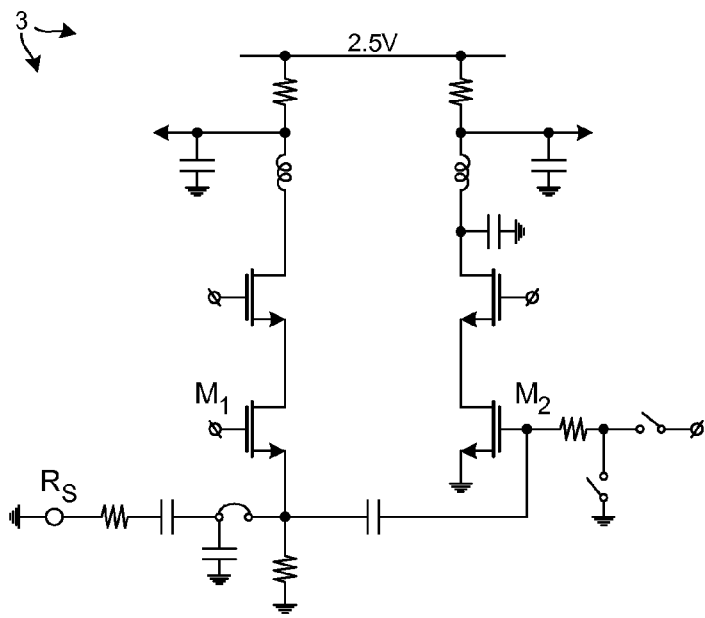
FIG. 3 (Prior Art) is a circuit diagram of a single-ended input, differential output wideband non-tunable LNA.
Figure 4:
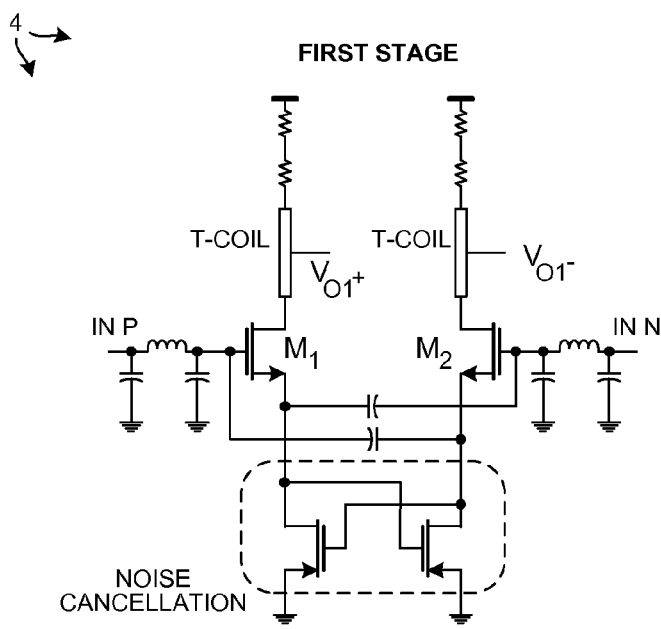
FIG. 4 (Prior Art) is a circuit diagram of a first stage of a differential wideband non-tunable LNA.
Figure 5:
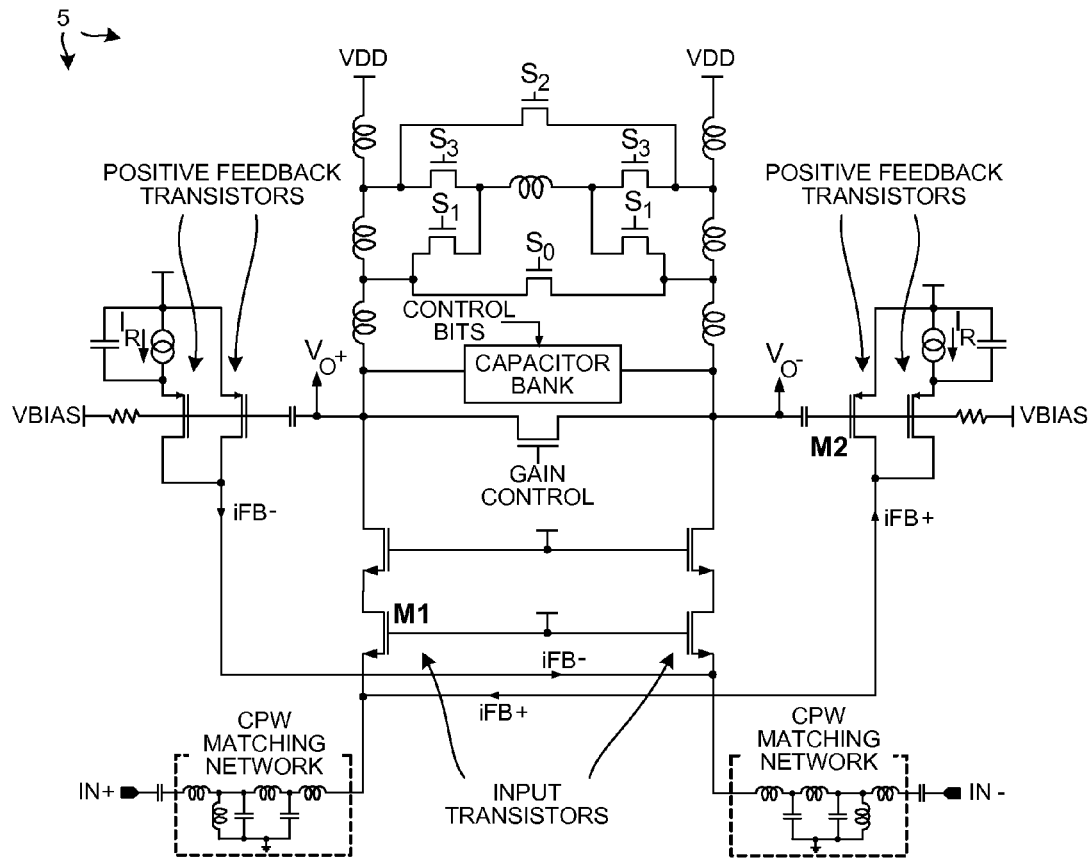
FIG. 5 (Prior Art) is a circuit diagram of a tunable wideband PFCGLNA.
Figures 10, 11:
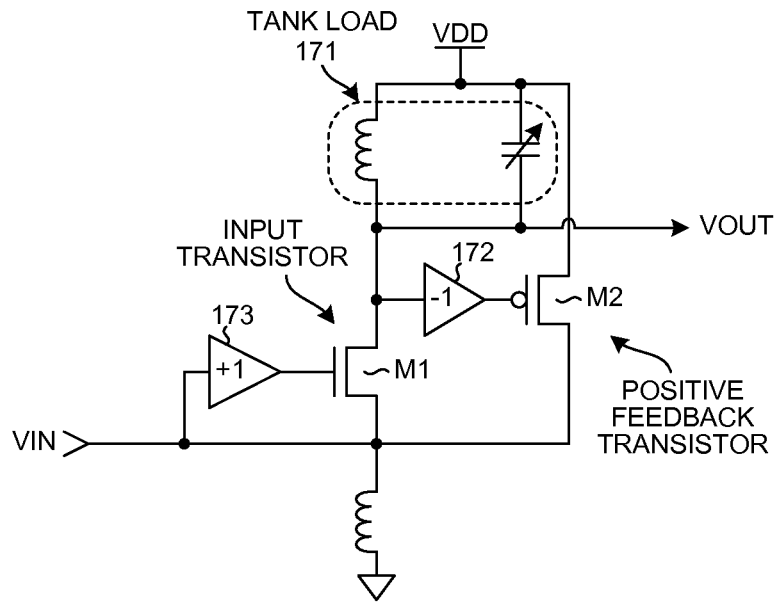
FIG. 10 is a simplified model of a single-ended example of the conventional PFCGLNA of FIG. 5.
FIG. 11 is an equation of the input impedance of the conventional PFCGLNA of FIG. 10.

FIGS. 10-14 illustrate how the PFCGLNA of FIG. 9 has improved stability as compared to the conventional PFCGLNA of FIG. 5. FIG. 10 is a model circuit of a single-ended example of the conventional PFCGLNA of FIG. 5. The transistor labeled M2 and inverting triangle 172 in FIG. 10 represent the positive feedback circuitry of FIG. 5. The transistor labeled M1 and the non-inverting triangle 173 represent the input transistor circuitry of FIG. 5.

FIG. 11 is an equation for the input impedance of the model circuit of FIG. 10. Note that there is a negative sign in the denominator term and that for certain $G_{M2}/G_{M1}$ transconductance ratios the denominator will be negative. This indicates instability of the circuit.

Figure 12:
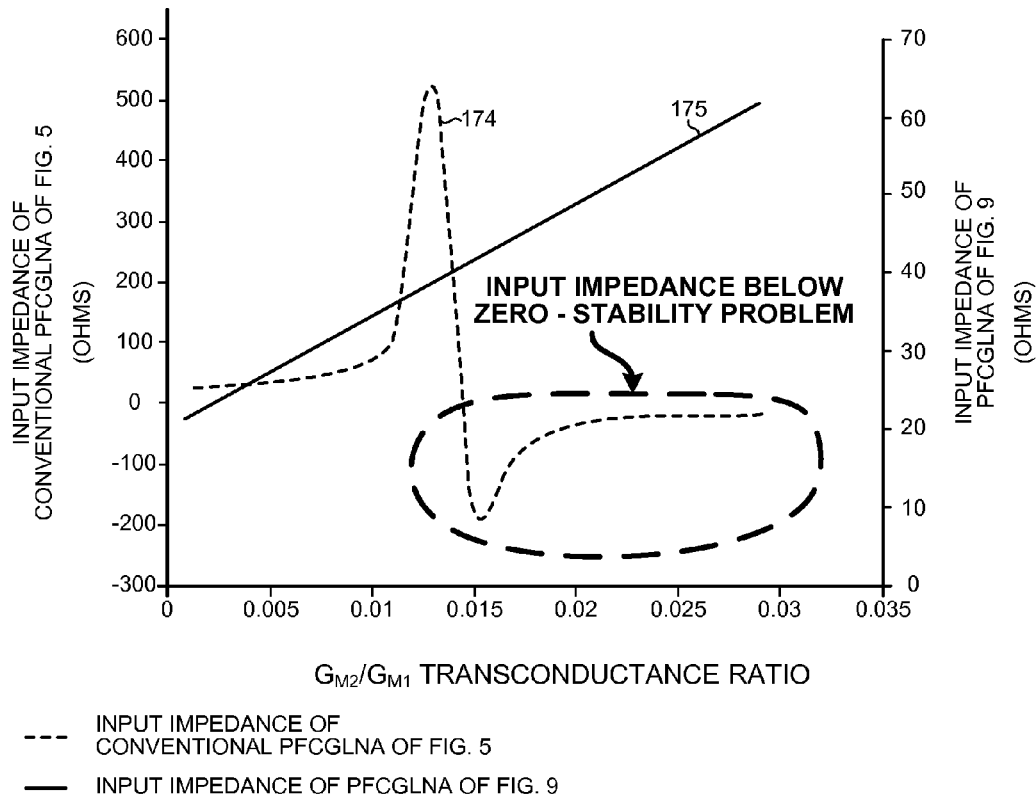
FIG. 12 shows how input impedance varies as a function of $G_{M2}/G_{M1}$ transconductance ratio for the conventional PFCGLNA of FIG. 5 and for the novel PFCGLNA of FIG. 9.

FIG. 12 shows how input impedance of the model circuit of FIG. 10 varies as a function of the $G_{M2}/G_{M1}$ transconductance ratio. Dashed line 174 represents the input impedance of the model circuit of FIG. 10 and the vertical scale for this line is on the left vertical axis. The dashed line 174 being below zero represents instability.

Figures 13, 14:
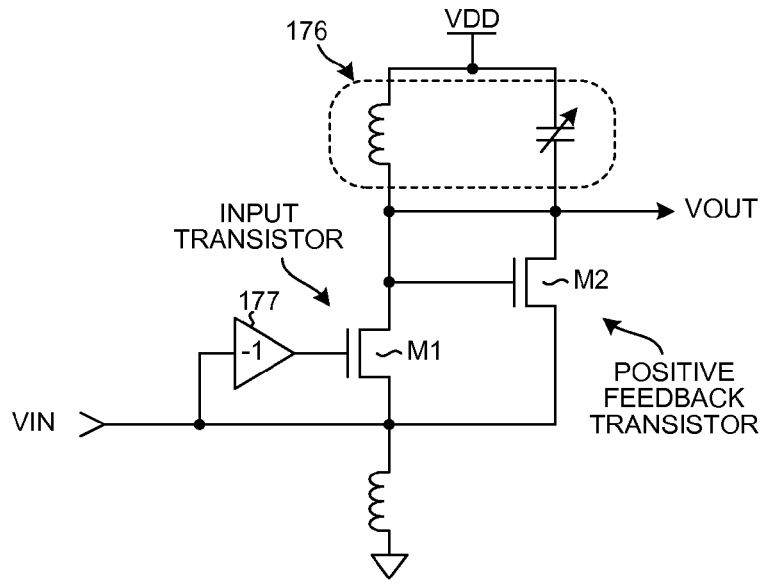
FIG. 13 is a simplified model of a single-ended example of the PFCGLNA of FIG. 9.
FIG. 14 is an equation of the input impedance of the PFCGLNA of FIG. 13.

FIG. 13 is a model circuit of a single-ended example of the PFCGLNA of FIG. 9. The transistor labeled M2 in FIG. 13 represents the positive feedback circuitry of FIG. 9. The transistor labeled M1 and the non-inverting triangle 177 represent the input transistor circuitry of FIG. 9.

FIG. 14 is an equation for the input impedance of the model circuit of FIG. 13. Note that the denominator term remains greater than zero regardless of how the $G_{M2}/G_{M1}$ transconductance ratio might vary. Line 175 in FIG. 12 shows how the input impedance of the model circuit of FIG. 13 changes as a function of the $G_{M2}/G_{M1}$ transconductance ratio. The vertical scale for line 175 is on the right vertical axis. The impedance is positive over the entire range of transconductance ratios illustrated in the figure. This represents stability and insensitivity of the design to variations in $G_{M2}/G_{M1}$ transconductance ratio values.

FIGS. 15-18 illustrate how the PFCGLNA of FIG. 9 has improved noise characteristics as compared to the conventional PFCGLNA of FIG. 5. FIG. 15 is an equation for noise at the input transistor. The term 178 is due to positive feedback. Because the term has a negative sign, positive feedback can make the overall denominator smaller thereby increasing input transistor noise.

FIG. 16 is an equation for noise at the positive feedback transistor of the conventional PFCGLNA of FIG. 5. The term 179 is due to positive feedback. Because the term has a negative sign, positive feedback can make the overall denominator smaller thereby increasing positive feedback transistor noise.

FIG. 17 is an equation for noise at the input transistor of the PFCGLNA of FIG. 9. The term 180 is due to positive feedback. Because the denominator has no negative sign, increasing positive feedback makes the overall denominator larger and therefore decreases input transistor noise.

FIG. 18 is an equation for noise at the positive feedback transistor of the PFCGLNA of FIG. 9. The term 181 is due to positive feedback. Because the denominator has no negative sign, increasing positive feedback makes the overall denominator larger and therefore decreases positive feedback transistor noise.

Figure 19:
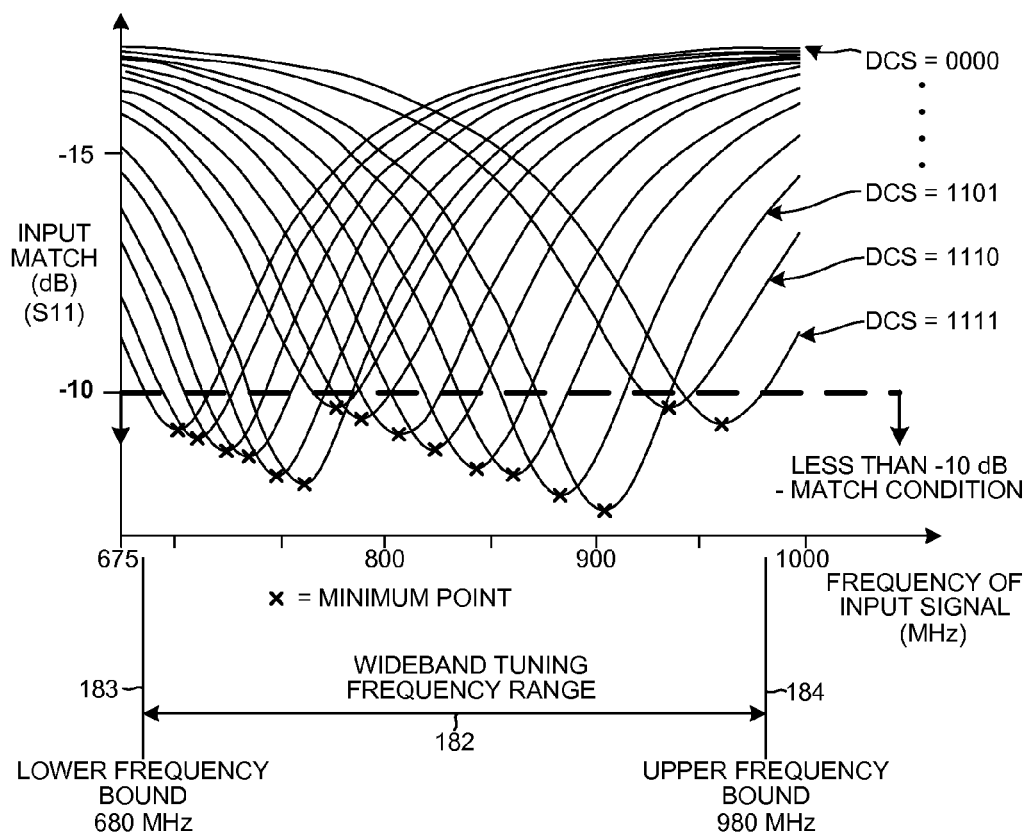
FIG. 19 is a diagram showing how the input impedance of the PFCGLNA of FIG. 9 can be kept substantially constant for an input signal frequency anywhere in a wideband tuning frequency range from 680 MHz to 980 MHz.

FIG. 19 is a diagram showing how the input impedance of the PFCGLNA of FIG. 9 can be kept substantially constant for an input signal frequency anywhere in a wideband tuning frequency range 182 from 680 MHz to 980 MHz. In this example, DCS is a digital four-bit value. Each of the sixteen graphs corresponds to a particular DCS value setting. The minimum of each graph is marked with an X. When a minimum falls below −10 dB, the input impedance of the LNA is deemed to be matched to the impedance of the driving circuit. In the example of FIG. 19, the source impedance is fifty ohms and is constant throughout the wideband tuning frequency range 182. The wideband tuning frequency range 182 extends from a lower frequency bound 183 at 680 MHz, to an upper frequency bound 184 at 980 MHz. The upper frequency bound 184 is at least one and one-third times the lower frequency bound 183. Accordingly, the impedance matching over this wideband range as indicated in FIG. 19 indicates that the input impedance of the PFCGLNA can be made to be a constant value regardless of input signal frequency in this range.

Figure 20:
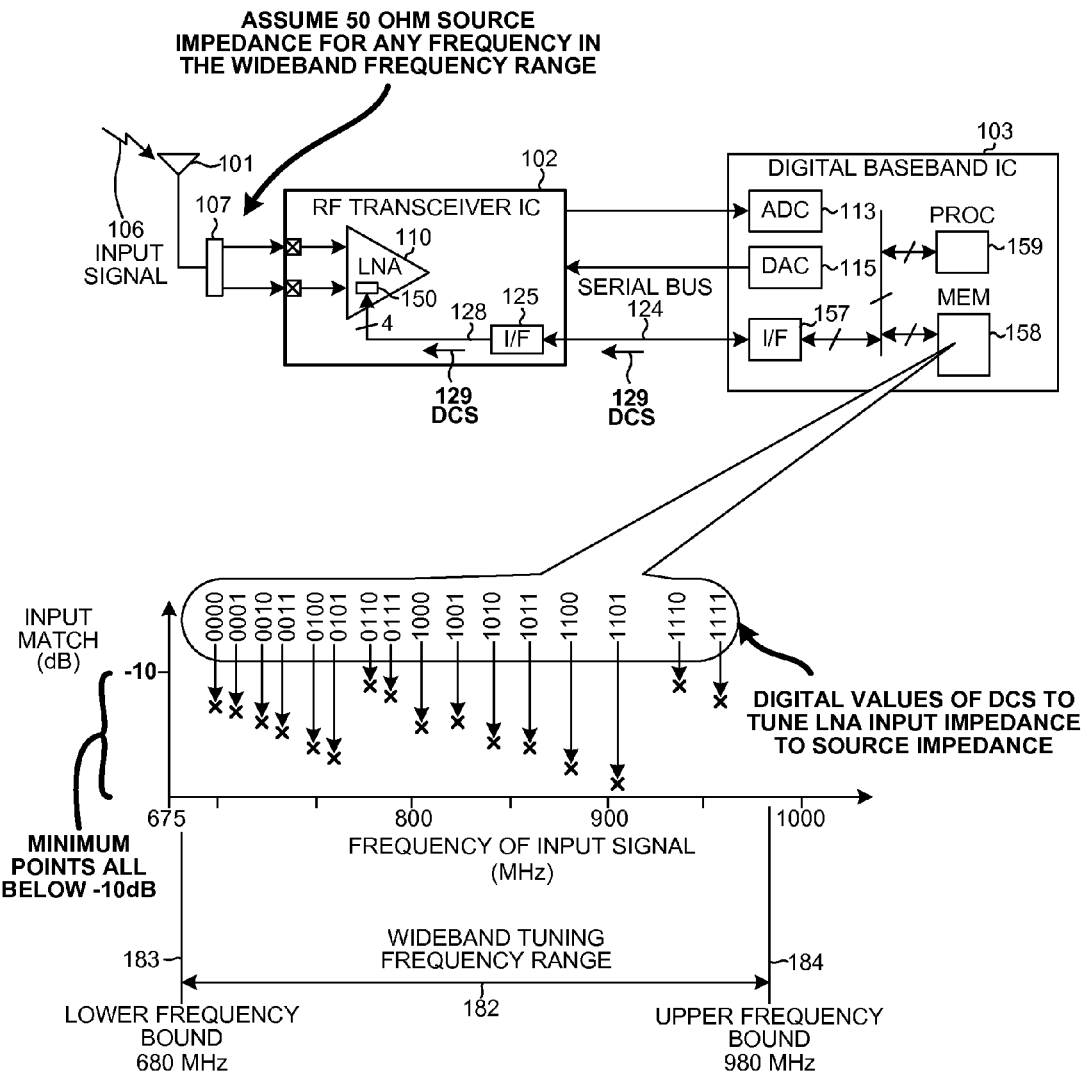
FIG. 20 is a diagram showing how the digital baseband integrated circuit 103 can change the DCS value that tunes the PFCGLNA such that the input impedance of the PFCGLNA remains substantially constant for an input signal frequency anywhere in a wideband tuning frequency range from 680 MHz to 980 MHz.

FIG. 20 is a diagram showing how the digital baseband integrated circuit 103 can change the DCS value that sets the input impedance of the PFCGLNA 110 of FIG. 9. In this example, the DCS values are set such that the input impedance of the PFCGLNA remains substantially constant for an input signal frequency anywhere in a wideband tuning frequency range from 680 MHz to 980 MHz. DCS values are stored in memory 158 of the digital baseband integrated circuit 103. Digital baseband integrated circuit 103 consults a lookup table in memory 158 where the lookup table stores, for each of a number of ranges of input signal frequencies, an appropriate DCS value. For example, if the frequency of the input signal is 700 MHz then the lookup table indicates a DCS value 129 of 0000. Processor 159 programs the digitally-programmable tank load 150 with this DCS value 129 of 0000 by communicating the DCS value 129 via serial bus interface 157, serial bus 124, serial bus interface 125, and conductors 128, to tank load 150.

Figure 21:
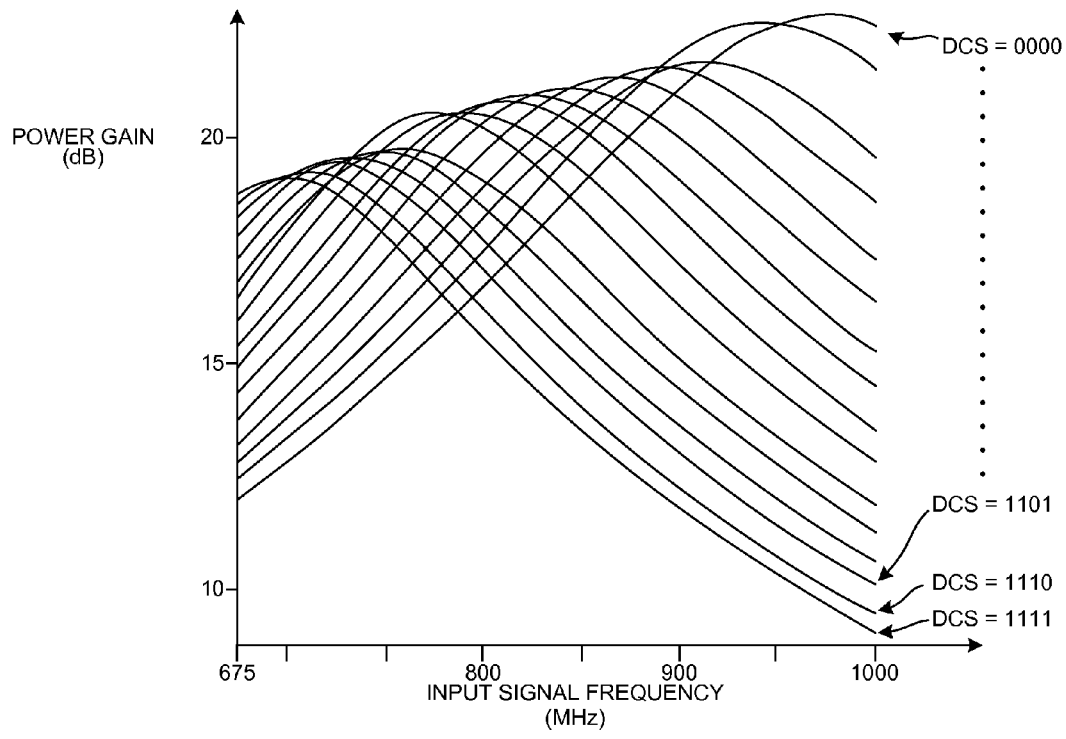
FIG. 21 is a diagram of the power gain of the PFCGLNA of FIG. 9 as a function of input signal frequency.

FIG. 21 is a diagram of the power gain of the PFCGLNA 110 of FIG. 9 as a function of input signal frequency. Each of the sixteen graphs corresponds to the power gain of the PFCGLNA when its tank load is programmed with a particular four-bit DCS value.

Figure 22:
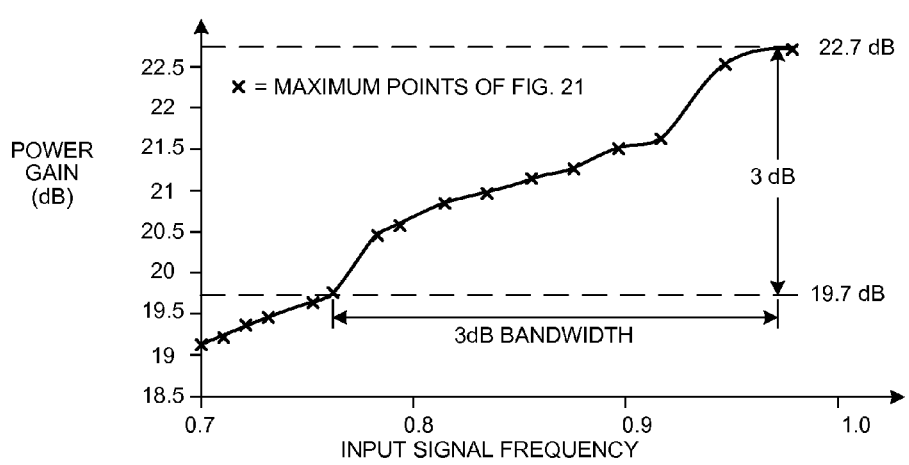
FIG. 22 is a diagram showing the 3 dB bandwidth of the PFCGLNA of FIG. 9.

FIG. 22 is a diagram showing the 3 dB bandwidth of the PFCGLNA 110 of FIG. 9. The X's in FIG. 22 represent the maximums of the power gain graphs of FIG. 21. From an input signal frequency from approximately 760 MHz to approximately 980 MHz, the power gain of the PFCGLNA varies no more than 3 dB. This frequency range is known as the 3 dB bandwidth.

Figure 23:
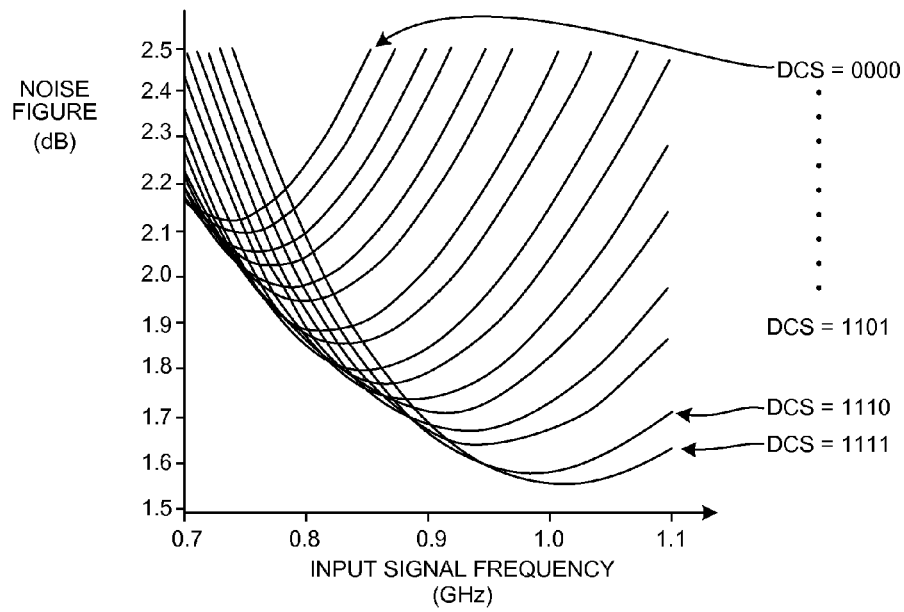
FIG. 23 is a diagram showing how the noise figure of the PFCGLNA of FIG. 9 changes as a function of input signal frequency for each of the variety of DCS settings.

FIG. 23 is a diagram showing how the noise figure of the PFCGLNA 110 of FIG. 9 changes as a function of input signal frequency for each of the variety of DCS settings. Each of the sixteen graphs represents the noise figure of the PFCGLNA when the tank load is programmed with a particular four-bit DCS value.

Figure 24:
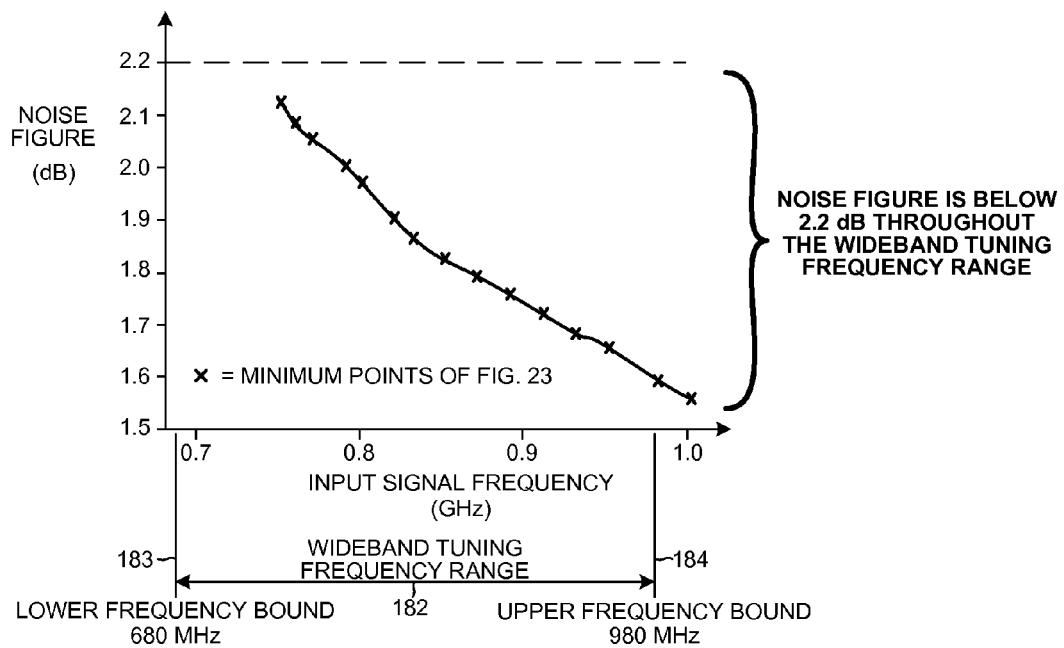
FIG. 24 is an extrapolated graph of the minimum points of each noise figure graph of FIG. 23.

FIG. 24 is a diagram that shows that the noise figure of PFCGLNA 110 of FIG. 9 is below 2.2 dB for an input signal frequency anywhere in the wideband tuning frequency range 182. Wideband tuning frequency range 182 extends from a lower frequency bound 183 of 680 MHz to an upper frequency bound 184 of 980 MHz.

Figure 25:
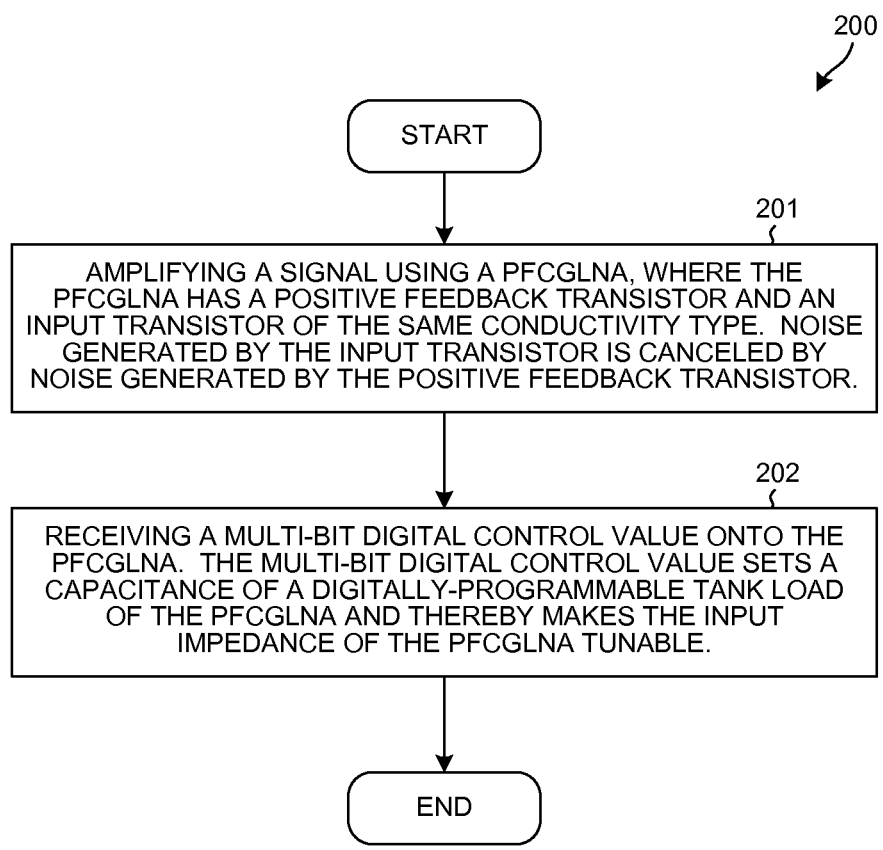
FIG. 25 is flowchart of a method 200 in accordance with one novel aspect.

FIG. 25 is a flowchart of a method 200 in accordance with one novel aspect. In a first step (step 201), a signal is amplified using a PFCGLNA that has a positive feedback transistor and an input transistor of the same conductivity type. Noise generated by the input transistor is canceled by the noise generated by the positive feedback transistor. For example, in FIG. 9A, PFCGLNA 110 amplifies input signal RF+ 133. Signal RF+ 133 is received on input signal conductor 135, and an amplified version of the input signal is supplied on output conductor 141. PFCGLNA 110 has a positive feedback transistor 147 and an input transistor 151. Positive feedback transistor 147 and input transistor 151 are both NFETs.

In a second step (step 202), a multi-bit digital control value is received on the PFCGLNA. The multi-bit digital control value sets a capacitance of a digitally-programmable tank load of the PFCGLNA. The input impedance of the PFCGLNA is determined by the capacitance of the digitally-programmable tank load and is controlled by the multi-bit digital control value. For example, in FIG. 9A, a DCS 129 is received on the PFCGLNA 110 via conductors 128 and is supplied to a digitally-programmable tank load 150. DCS 129 controls the capacitance of digitally-programmable tank load 150 by controlling a set of switches 162 and 164, and these switches determine how many of the capacitors are coupled together in parallel. The tank load 150 can be tuned in this way by setting DCS 129 so that the input impedance of PFCGLNA 110 can be controlled.

Although certain specific embodiments are described above for instructional purposes, the teachings of this patent document have general applicability and are not limited to the specific embodiments described above. For example, different techniques for tuning LNA 110 of FIG. 9A may be utilized. Multi-bit signal DCS 129 need not be a four-bit value. A tank load could receive an eight-bit or sixteen-bit value instead of a four-bit value, and provide more precise input matching characteristics. LNA 110 need not be a differential LNA but rather can be a single-ended LNA. Although a situation is described where the source impedance is constant for changes in the frequency of the input signal, the source impedance may be controlled to vary in a desired way with input signal frequency. PFCGLNA 110 may be tuned so that it does not have optimal gain at the input signal frequency but does have a desired input impedance. PFCGLNA 110 may be controlled so that it is not impedance matched to its source at all input signal frequencies. Each positive feedback transistor can be implemented as a set of parallel-connected transistors, where a selected number of the transistors can be enabled so that the transconductance of the positive feedback transistor can be adjusted thereby changing LNA input impedance. Accordingly, various modifications, adaptations, and combinations of the various features of the described specific embodiments can be practiced without departing from the scope of the claims that are set forth below.

What is claimed is:
1. A common gate amplifier comprising:
an input leg including an input transistor of a conductivity type;
a digitally-programmable tank load coupled to the input leg; and
a positive feedback transistor of the conductivity type, wherein the positive feedback transistor has a source, wherein the input transistor has a source, and wherein the source of the positive feedback transistor is coupled to the source of the input transistor.

2. A common gate amplifier comprising:
an input leg including an input transistor of a conductivity type;
a digitally-programmable tank load coupled to the input leg; and
a positive feedback transistor of the conductivity type, wherein the common gate amplifier has an input impedance, wherein the common gate amplifier receives a multi-bit control value that controls the digitally-programmable tank load, wherein the input impedance is tunable to be substantially constant over a wideband tuning frequency range, wherein the wideband tuning frequency range extends from a lower frequency bound to an upper frequency bound, and wherein the upper frequency bound is at least one and one-third times the lower frequency bound.

3. A common gate amplifier comprising:
an input leg including an input transistor of a conductivity type;
a digitally-programmable tank load coupled to the input leg; and
a positive feedback transistor of the conductivity type, wherein the common gate amplifier has an input impedance, wherein the common gate amplifier receives a multi-bit control value that controls the digitally-programmable tank load, wherein the input impedance is tunable to be substantially constant over a wideband tuning frequency range, wherein the wideband tuning frequency range extends from a lower frequency bound to an upper frequency bound, and wherein the upper frequency bound is at least one and one-third times the lower frequency bound, and further wherein the common gate amplifier has a Noise Figure (NF) throughout the wideband tuning frequency range less than 2.2 dB.

4. A common gate amplifier comprising:
an input leg including an input transistor of a conductivity type;
a digitally-programmable tank load coupled to the input leg; and
a positive feedback transistor of the conductivity type, wherein the common gate amplifier is operable over a wideband tuning frequency range, wherein the wideband tuning frequency range extends from a lower frequency bound to an upper frequency bound, wherein the upper frequency bound is at least one and one-third times the lower frequency bound, and wherein the common gate amplifier has a Noise Figure (NF) throughout the wideband tuning frequency range less than 2.2 dB.

5. A common gate amplifier comprising:
an input leg including an input transistor of a conductivity type;
a digitally-programmable tank load coupled to the input leg; and
a positive feedback transistor of the conductivity type,
an input signal conductor coupled to a source of the input transistor; and
an output signal conductor coupled to the digitally-programmable tank load, wherein the positive feedback transistor has a drain coupled to the output signal conductor, wherein the positive feedback transistor has a source coupled to the input signal conductor, and wherein the positive feedback transistor has a gate that is capacitively coupled to the output signal conductor.

6. A common gate low noise amplifier, comprising:
a first input signal conductor;
a second input signal conductor;
a first input leg including a first input transistor of a conductivity type and a first cascode transistor, wherein a gate of the first input transistor is capacitively coupled to the second input signal conductor;
a second input leg including a second input transistor of the conductivity type and a second cascode transistor, wherein a gate of the second input transistor is capacitively coupled to the first input signal conductor;
a digitally-programmable tank load having a first lead coupled to a drain of the first cascode transistor, and having a second lead coupled to a drain of the second cascode transistor;
a first positive feedback transistor of the conductivity type, wherein a gate of the first positive feedback transistor is capacitively coupled to the drain of the first cascode transistor, and wherein a source of the first positive feedback transistor is coupled to a source of the first input transistor; and
a second positive feedback transistor of the conductivity type, wherein a gate of the second positive feedback transistor is capacitively coupled to the drain of the second cascode transistor, and wherein a source of the second positive feedback transistor is coupled to a source of the second input transistor.

7. The common gate low noise amplifier of claim 6, wherein the first cascode transistor has a source coupled to a drain of the first input transistor, and wherein the second cascode transistor has a source coupled to a drain of the second input transistor.

8. The common gate low noise amplifier of claim 6, wherein the drain of the first cascode transistor is coupled to a drain of the first positive feedback transistor, and wherein the drain of the second cascode transistor is coupled to a drain of the second positive feedback transistor.

9. The common gate low noise amplifier of claim 6, wherein the common gate amplifier has an input impedance, wherein the common gate amplifier receives a multi-bit control value that controls the digitally-programmable tank load, wherein the input impedance is tunable to be substantially constant over a wideband tuning frequency range, wherein the wideband tuning frequency range extends from a lower frequency bound to an upper frequency bound, and wherein the upper frequency bound is at least one and one-third times the lower frequency bound.

10. The common gate low noise amplifier of claim 9, wherein the common gate amplifier has a Noise Figure (NF) throughout the wideband tuning frequency range less than 2.2 dB.

11. A method comprising:
amplifying a signal using a Positive Feedback Common Gate Low Noise Amplifier (PCFGLNA) having a positive feedback transistor and an input transistor of the same conductivity type, wherein the PFCGLNA is operable over a wideband tuning frequency range, wherein the wideband tuning frequency range extends from a lower frequency bound to an upper frequency bound, wherein the upper frequency bound is at least one and one-third times the lower frequency bound, and wherein the PFCGLNA has a Noise Figure (NF) throughout the wideband tuning frequency range less than 2.2 dB;
receiving a multi-bit digital control value that sets a capacitance of a digitally-programmable tank load of the PFCGLNA.

12. A method comprising:
amplifying a signal using a Positive Feedback Common Gate Low Noise Amplifier (PCFGLNA) having a positive feedback transistor and an input transistor of the same conductivity type, wherein the PFCGLNA is operable over a wideband tuning frequency range, wherein the wideband tuning frequency range extends from a lower frequency bound to an upper frequency bound, wherein the upper frequency bound is at least one and one-third times the lower frequency bound, and wherein the PFCGLNA has a Noise Figure (NF) throughout the wideband tuning frequency range less than 2.2 dB, and further wherein the PFCGLNA has an input impedance, and the input impedance is tunable by changing the multi-bit digital control value; and receiving a multi-bit digital control value that sets a capacitance of a digitally-programmable tank load of the PFCGLNA.

13. A method comprising:

amplifying a signal using a Positive Feedback Common Gate Low Noise Amplifier (PCFGLNA) having a positive feedback transistor and an input transistor of the same conductivity type, wherein the PFCGLNA is operable over a wideband tuning frequency range, wherein the wideband tuning frequency range extends from a lower frequency bound to an upper frequency bound, wherein the upper frequency bound is at least one and one-third times the lower frequency bound, and wherein the PFCGLNA has a Noise Figure (NF) throughout the wideband tuning frequency range less than 2.2 dB, and further wherein the PFCGLNA has an input impedance, the input impedance is tunable by changing the multi-bit digital control value and wherein the input impedance is tunable to be substantially constant over the wideband tuning frequency range; and receiving a multi-bit digital control value that sets a capacitance of a digitally-programmable tank load of the PFCGLNA.

14. A method comprising:

amplifying a signal using a Positive Feedback Common Gate Low Noise Amplifier (PCFGLNA) having a positive feedback transistor and an input transistor of the same conductivity type, wherein the PFCGLNA is operable over a wideband tuning frequency range, wherein the wideband tuning frequency range extends from a lower frequency bound to an upper frequency bound, wherein the upper frequency bound is at least one and one-third times the lower frequency bound, and wherein the PFCGLNA has a Noise Figure (NF) throughout the wideband tuning frequency range less than 2.2 dB, and further wherein the PFCGLNA has an input impedance tunable by changing the multi-bit digital control value, wherein noise generated by the positive feedback transistor cancels noise generated by the input transistor; and receiving a multi-bit digital control value that sets a capacitance of a digitally-programmable tank load of the PFCGLNA.

15. A common gate low noise amplifier comprising:

an input signal conductor; and means for amplifying an input signal received onto the input signal conductor such that the common gate low noise amplifier has a Noise Figure (NF) less than 2.2 dB throughout a wideband tuning frequency range, wherein the wideband tuning frequency range extends from a lower frequency bound to an upper frequency bound, wherein the upper frequency bound is at least one and one-third times the lower frequency bound, and wherein the means is tunable to have a substantially constant input impedance throughout the wideband tuning frequency range.

16. The common gate low noise amplifier of claim 15, wherein the means is also for using noise generated by a positive feedback transistor to cancel noise generated by an input transistor.

17. The common gate low noise amplifier of claim 16, wherein the positive feedback transistor and the input transistor are of the same conductivity type.

18. The common gate low noise amplifier of claim 15, wherein the means is also for receiving a multi-bit digital control signal for setting a capacitance of a digitally-programmable tank load.

* * * * *